United States Patent [19]
Le et al.

[11] Patent Number: 6,055,366
[45] Date of Patent: Apr. 25, 2000

[54] METHODS AND APPARATUS TO PERFORM HIGH VOLTAGE ELECTRICAL RULE CHECK OF MOS CIRCUIT DESIGN

[75] Inventors: Binh Quang Le, Mountain View; Pau-Ling Chen, Saratoga; Shane Hollmer, San Jose; Alexius H. Tan, Fremont, all of Calif.

[73] Assignee: Advanced Micro Devices, Inc., Sunnyvale, Calif.

[21] Appl. No.: 09/028,123

[22] Filed: Feb. 23, 1998

[51] Int. Cl.$^7$ ............................................... G06F 17/50
[52] U.S. Cl. .............................. 395/500.06; 395/500.02
[58] Field of Search ........................... 395/500.06, 500.02

[56] References Cited

U.S. PATENT DOCUMENTS

| | | | |
|---|---|---|---|
| 5,050,091 | 9/1991 | Rubin | 395/500.11 |
| 5,416,722 | 5/1995 | Edwards | 395/500.03 |
| 5,526,517 | 6/1996 | Jones et al. | 707/8 |
| 5,581,475 | 12/1996 | Majors | 395/500.11 |
| 5,787,006 | 7/1998 | Chevallier et al. | 395/500.06 |

OTHER PUBLICATIONS

Ries; "Rule–Based Implementation of Correct and Efficient VLSI Design Rule Checking"; IEEE: Int. Workshop on Industrial Applic. of Machine Intell. and Vision; pp. 205–209, Apr. 1989.

Nunes et al.; "A New Approach to Perform Circuit Verification Using O(n) Algorithms"; IEEE: Euromicro 94, Proceedings; pp. 428–434, Sep. 1994.

Suzuki et al.;"A Practical Online Design Rule Checking System"; IEEE: 27th ACM/IEEE Design Automation Conf.; pp. 246–252, Jun. 1990.

Khwaja; "Enhanced Extensibility of the Design Rule Checker of an EDA Tool by Object–Oriented Modeling"; IEEE: 21st Int. Computer Software and Applications Conf.; pp. 104–108, Aug. 1997.

*Primary Examiner*—Kevin J. Teska
*Assistant Examiner*—Hugh Jones
*Attorney, Agent, or Firm*—Fliesler, Dubb, Meyer & Lovejoy

[57] ABSTRACT

A two part high voltage check program creates a circuit simulator input file, analyzes the resulting circuit simulator output file for design rule violations, and produces a user report of all violations. The user creates a transistor file which indicates which blocks are to be checked, and optionally specifies individual transistors within the block for checking. The user creates a rule file including rule definitions for the various different types of transistors in the design. The first part generates a print file for input to a circuit simulator. The second part reads the print file, the rule file, and the simulator output file. The second part produces a transistor linked list which is linked to the rule linked list. The second part reads the simulator output file line by line and performs the high voltage electrical rule checks for each transistor for each time step. The second part produces a violation linked lists for each transistor for each violation type. Only tine points representing the beginning or end of a violation sequence are added to the violation linked lists. The second part maintains variables corresponding to each violation type which indicate the maximum violation amount and time for each transistor. The second part produces reports for each transistor's violations, and deallocates the violation linked lists after each transistor has been fully checked. The high voltage rule check program uses dynamic linked list data structures to effectively minimize DRAM utilization at run time.

20 Claims, 14 Drawing Sheets

FIG. 5

| | |
|---|---|
| Transistor Index 503 | Integer |
| Select 516 | Integer |
| Block Name 504 | String |
| Block Path 505 | String (20) |
| Instance Name 506 | String (40) |
| Drain 507 | String (25) |
| Gate 508 | String (15) |
| Source 509 | String (15) |
| Bulk 510 | String (15) |
| Spice Parameter 511 | String (10) |
| Channel Width 512 | Float |
| Channel Length 513 | Float |
| Component Name 501 | String (25) |
| M Factor 514 | String (15) |
| Pointer to Next Transistor 515 | |
| Pointer to a Rule 502 | |

500

FIG. 7
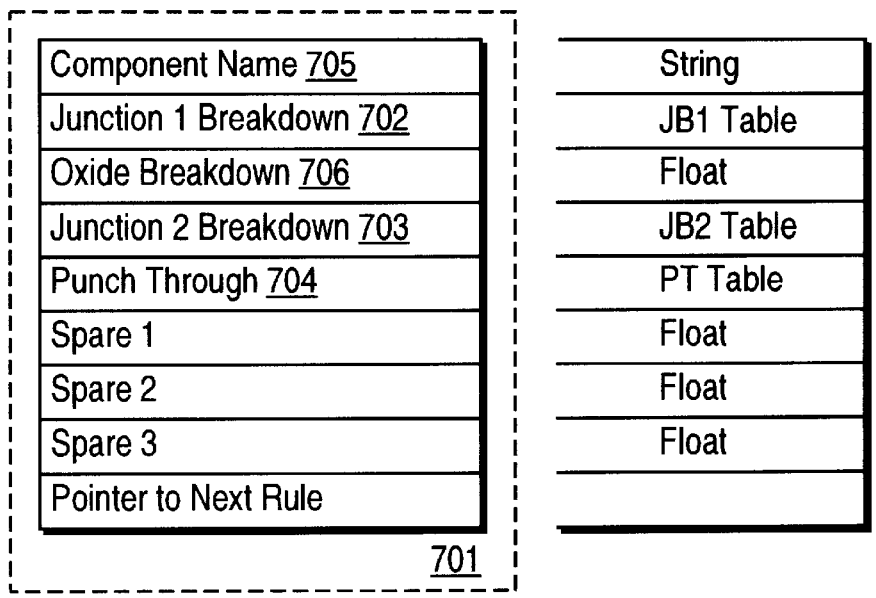
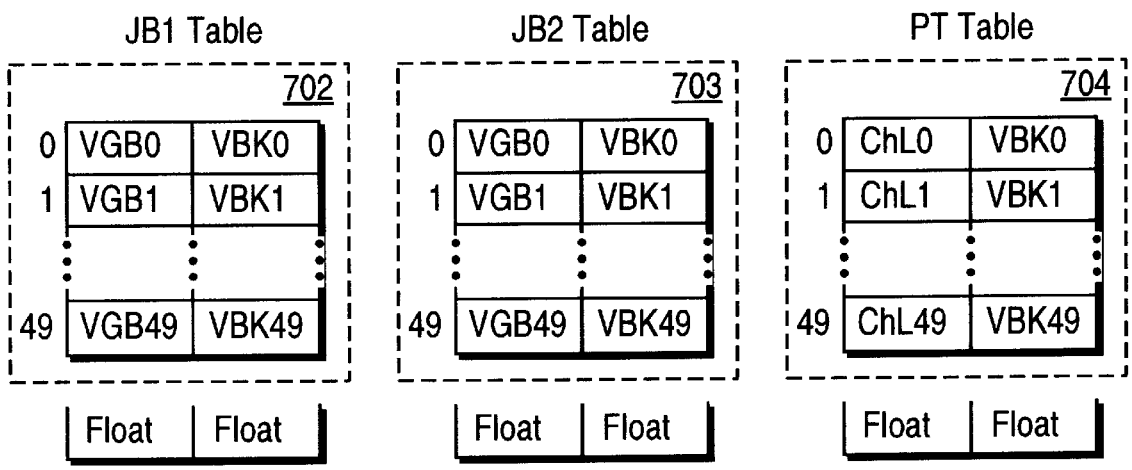

FIG. 13

| Identifier 1301 | String |
|---|---|
| Time 1302 | Float |
| Drain Voltage 1303 | Float |
| Gate Voltage 1304 | Float |
| Source Voltage 1305 | Float |
| Bulk Voltage 1306 | Float |
| Pointer to Next Violation | |

| Maximum Violation | Float |
|---|---|
| Time | Float |

METHODS AND APPARATUS TO PERFORM HIGH VOLTAGE ELECTRICAL RULE CHECK OF MOS CIRCUIT DESIGN

BACKGROUND OF THE INVENTION

1. Field of the Invention

The present invention relates to the field of electrical rule checking of integrated circuit designs. Specifically, the present invention relates to computer-aided generation of input files for circuit simulators and computer-aided analysis of circuit simulator output for high voltage MOS design rule violations.

2. Discussion of the Related Art

In MOS integrated circuit design, it is necessary to guarantee that certain electrical design rules are never violated. For example, in MOS devices, if the voltage across the gate oxide exceeds the amount which can be handled by the gate oxide, a charge transfer may rupture the gate oxide, causing device failure or unreliability. This is called gate oxide breakdown.

Similarly, if the voltage from the source to drain or drain to source is too large to be carried by the channel of a MOS device, a large current may "punch through" the channel, causing circuit failure and sometimes damaging the device due to excessive heating. This is particularly true at small channel lengths and high voltages. Another type of failure occurs if the source or drain voltage of a MOS device is too high relative to the bulk. Here, the source or drain to bulk junction may breakdown, causing erroneous unintended circuit behavior.

These types of problems can be avoided by formulating and following certain high voltage electrical design rules.

In most low-voltage MOS integrated circuits, the circuit can be designed so that all the transistors will behave properly and will not be damaged under any normal operating circumstances. In other words, the highest specified supply voltages will never cause the any of the internal MOS devices to fail or operate improperly.

However, flash memory devices utilize the internal generation of high voltages which are much higher than the highest supply voltages of the devices. It is difficult to guarantee that these high voltage design rules will never be violated.

Circuit designers frequently use circuit simulators such as SPICE to perfect circuit performance and to attempt to develop circuits which adhere to the electrical design rules. In order to guarantee adherence to the high voltage electrical design rules, it is desirable to be able to detect high voltage design rule violations that have occurred in a simulation. However, the transistor models used in these simulators typically do not model transistor failure or breakdown. Rather, the user must carefully monitor the transistor's circuit nodes to verify that none of the conditions which might cause problems have happened.

However, this is a very difficult tool because the high voltage electrical design rules themselves are non-linear voltage dependent rules which require monitoring voltage differentials between several dynamic nodes for each transistor. In the past circuit designers have relied upon manual checking of simulation reports and visual graphical analysis of simulation reports to try to detect high voltage design rule violations. This manual checking is tedious and very error prone.

As is apparent from the foregoing discussion, a need exists for an automated system for checking a circuit for high voltage design rule violations.

SUMMARY OF THE INVENTION

Conventionally high voltage design rule checking has been performed manually by resorting to tedious and error prone examination of simulation outputs.

According to the present invention, a two part high voltage check program creates a circuit simulator input file, analyzes the resulting circuit simulator output file for design rule violations, and produces a user report of all violations.

The user creates a transistor file which indicates which blocks are to be checked. Optionally, for a block named in the transistor file, the user specifies individual transistors within the block for checking. The user creates a rule file including rule definitions for the various different types of transistors in the design.

The first part of the high voltage rule check program reads the transistor file find a netlist file to generate a print file for input to the circuit simulator. The first part performs the generation of the print file on a block by block basis using dynamically allocated linked lists to conserve memory space. The user then runs the circuit simulator using the print file to produce a simulator output file.

The second part of the high voltage rule check program reads the transistor file, the netlist file, the rule file, and the simulator output file. The second part produces a transistor linked list which is linked to the rule linked list. The second part reads the simulator output file line by line and performs the high voltage electrical rule checks for each transistor for each time step.

The second part produces violation linked lists for each transistor for each violation type. Only time points representing the beginning or end of a violation sequence are added to the violation linked lists. The second part maintains variables corresponding to each violation type which indicate the maximum violation amount and time for each transistor. After each transistor has been checked, the data corresponding to its detected violations' start and end times are printed out as well as the data corresponding to its maximum violation amounts and times. The violation linked lists are deallocated after each transistor has been fully checked before proceeding to the next transistor in the transistor linked list.

Because the first part sequentially operates on blocks, and because the second part sequentially operates on individual transistors, the high voltage check program according to the present invention uses very little memory while having the capacity to process very large data files. New device types are easily incorporated by adding rule, into the rule file. The high voltage rule check program uses dynamic linked list data structures to effectively minimize DRAM utilization at run time.

These and other features and advantages of the present invention will be apparent from the Figures in conjunction with the Detailed Description of the Invention.

BRIEF DESCRIPTION OF THE DRAWINGS

FIG. 5 illustrates the various fields and data types for the transistor structures used in the transistor linked list according to the present invention.

FIG. 7 illustrates the various fields and data types for the rule structures used in the rule linked list according to the present invention.

FIG. 13 illustrates the various fields and data types corresponding to the elements of the violation linked lists and maximum violation variables illustrated in FIG. 12.

The Figures are more fully explained in the Detailed Description of the Invention. In FIGS. 1 through 13, like parts are identified by like numerals. The thousands and hundreds digit of each reference numeral indicates which Figure the part is first instantiated in. For example, element 515 can be found in FIG. 5; element 1401 is in FIG. 14; and element 701 is in FIG. 7.

DETAILED DESCRIPTION OF THE INVENTION

High voltage circuit designers have previously relied upon manual inspection of circuit simulation waveforms to attempt to located high voltage rule violations. This has been tedious and error prone. According to the present invention as described below, a high voltage design rule program creates a simulation input file, analyzes a simulator output file to detect high voltage violations, and reports violations to the user.

Figure 4:
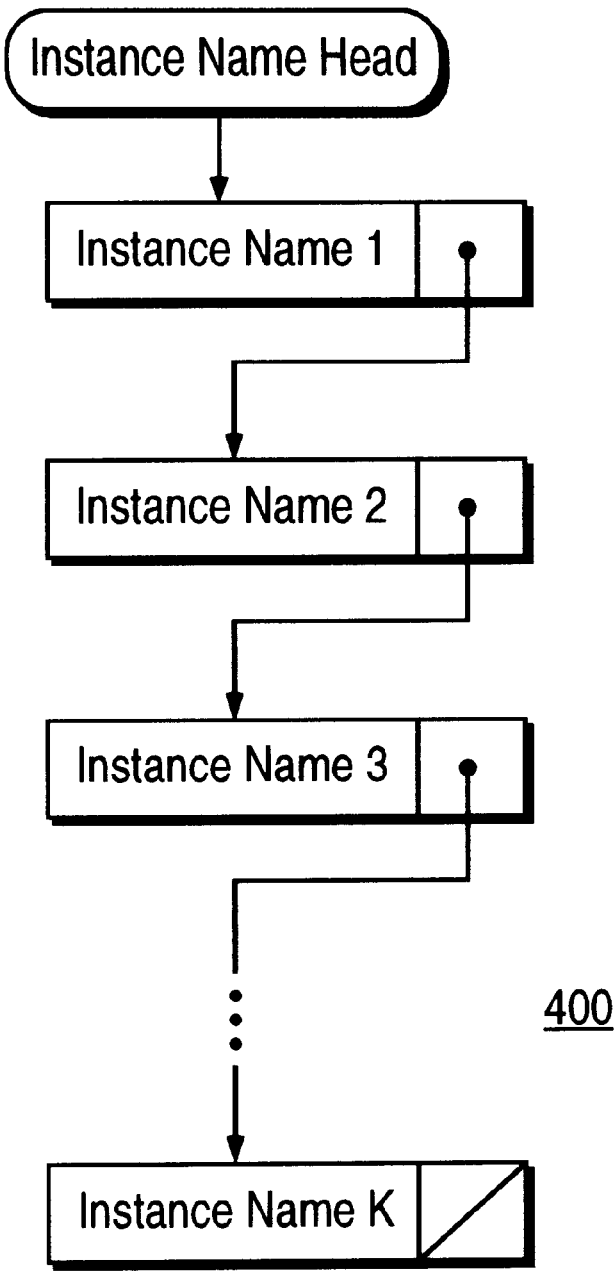
FIG. 4 illustrates an instance name linked list of instance names specified as selected for analysis by the user.
Figure 6:
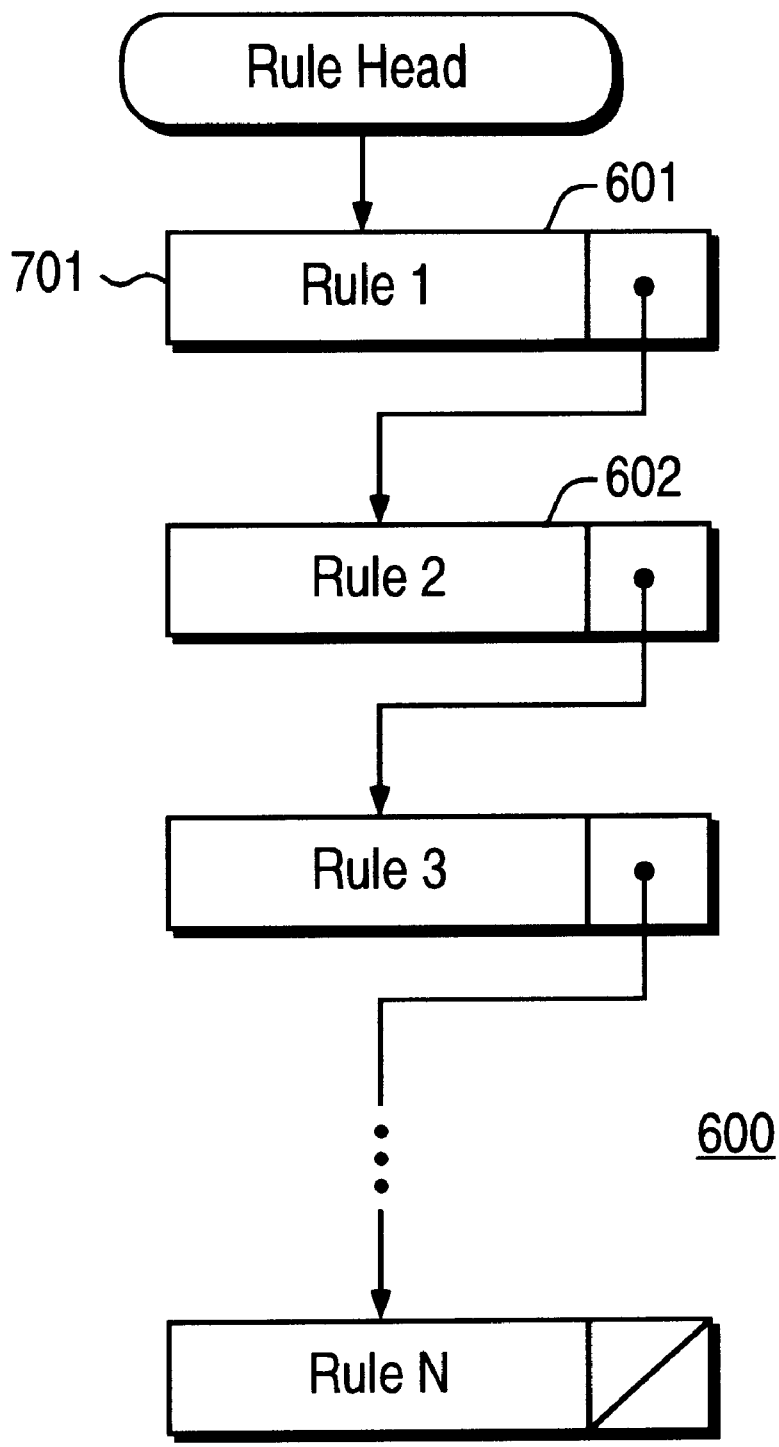
FIG. 6 illustrated a rule linked list of rule structures such as generated in the second part of the high voltage check program according to the present invention.

In the following description the thousands and hundreds digits of the reference numerals indicate which Figure the part being referred to may be located in. For example, element 400 is in FIG. 4.

Figure 1:
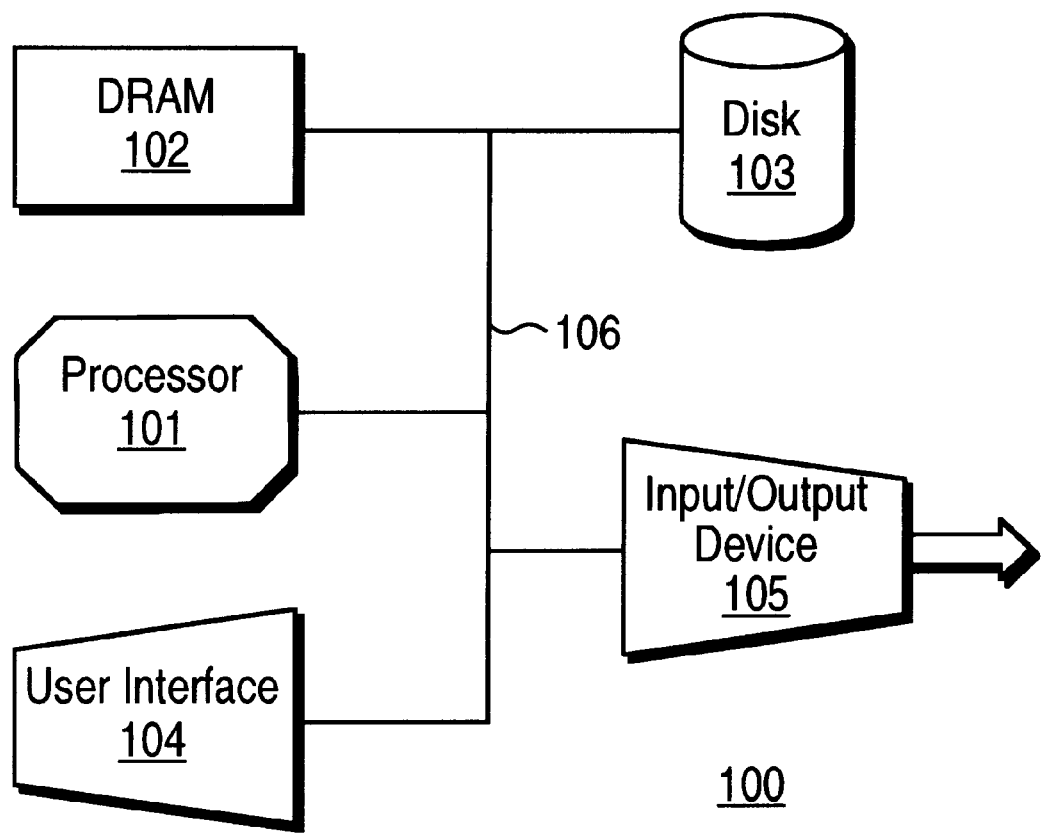
FIG. 1 illustrates a block diagram of a general purpose computer suitable for executing the programs in accordance with the methods and apparatuses of the present invention.

FIG. 1 illustrates an architecture of a general purpose computer 100 which is able to execute the high voltage check program according to the present invention. A user enters commands through a user interface 104 consisting of a display and keyboard. A processor 101 reads computer readable code and data from random access memory DRAM 102. A high capacity secondary storage device 103 provides program code and data which can be loaded into the DRAM 103. An input/output device 105 provides connectivity to various other elements, such as networks, modems, or printers.

Figure 14:
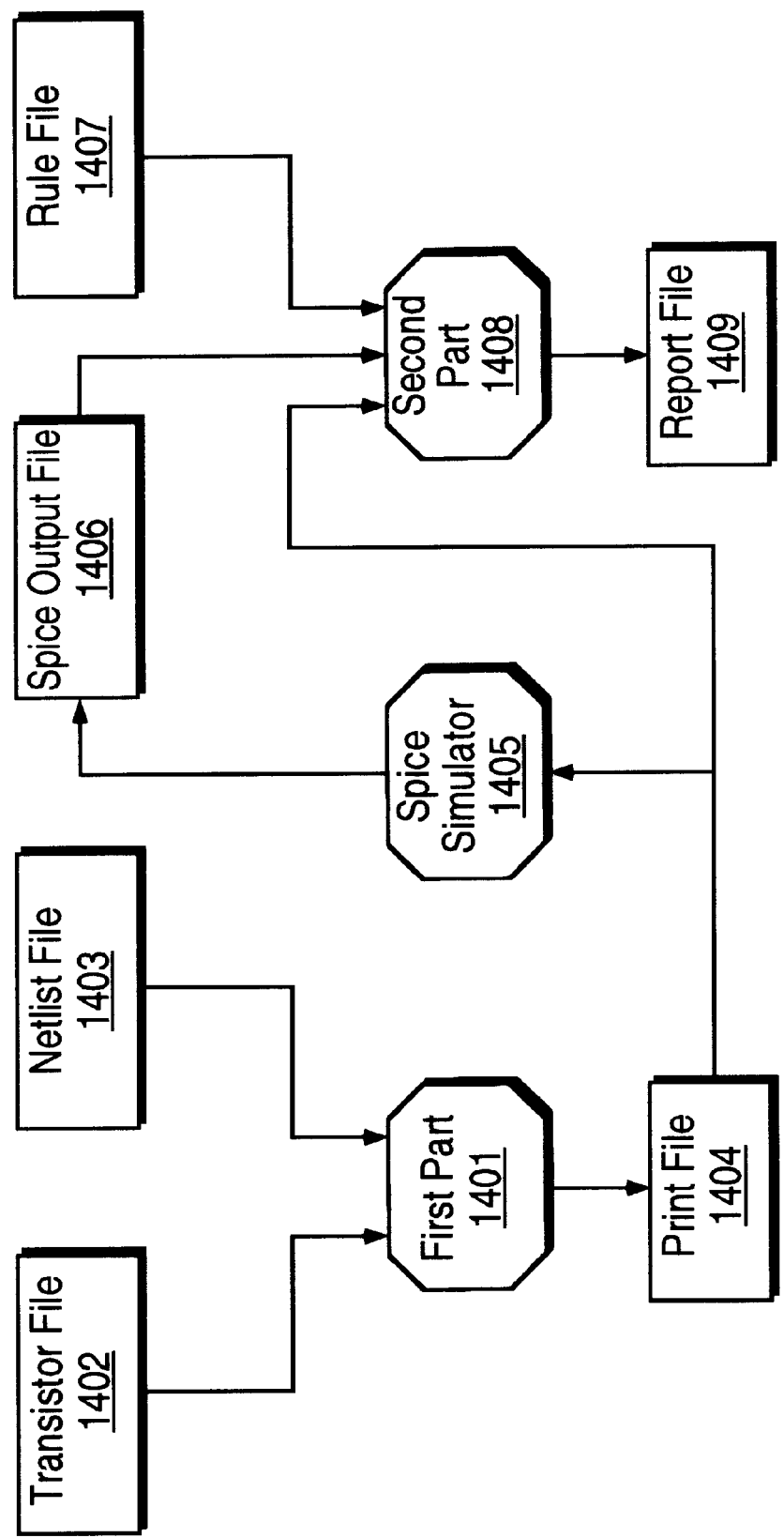
FIG. 14 illustrates the various files and programs that are required for the high voltage check program according to the present invention.

FIG. 14 illustrates the various files and programs used in the high voltage program according to the present invention. The high voltage check program according to the present intention includes two parts. The first part 1401 reads a transistor file 1402 and a netlist file 1403 to produce a print file 1404 which is used as input to a circuit simulator 1405 such as the SPICE simulator. The netlist file 1403 describes how various circuit nodes are interconnected.

The spice-formatted print file 1404 contains one print line for each transistor specified in the transistor input file 1402. At that end of each print line, the component name for the transistor corresponding to the print line is listed as a comment following a dollar sign "$". The component name specifies which type of transistor any given physical transistor is. Each unique component name corresponds to a different type of transistor.

The rule file 1407 is created by the user and specifies the electrical rules for each unique component name. The high voltage rule check program reads the transistor input file and creates a transistor linked list 300 of transistors which are to be checked for high voltage rule violations. The second part 1408 of the high voltage rule check program reads the rule file 1407 and creates a rule linked list 600 of the rules specified in the rule file 1407.

The second part 1408 of the high voltage rule check program links the transistor linked list 300 to the rule linked list 600 by providing a pointer from each transistor structure 500 in the transistor linked list 300 to a rule in the rule linked list 600. For each transistor structure 500 in the transistor linked list 300, this linking is accomplished by comparing the component name 501 of the transistor structure 500 to the component name 705 of the rule structure 701 in the first rule 601 of the rule linked list 600. If there is a match, the pointer within the transistor structure 500 is set to point to the first rule 601 in the rule linked list 600. If there is no match, the component name 501 of the transistor structure 500 is compared the next subsequent rule 602 in the rule linked list 600 until a match is found. Thus, the rule pointer 502 in the transistor structure 500 is set to point to the rule structure 701 within the rule linked list 600 which contains a component name 705 that matches the component name 501 within the transistor structure 500 of the transistor linked list 300.

The transistor structure 500 contains the following fields which are illustrated in FIG. 5. The transistor index 503 is an integer used to uniquely identify a particular physical transistor. In practice, a sequential transistor serial number is used as the transistor index 503. For example, the first transistor 301 has transistor index "1", the second transistor 302 has an index of "2", and so forth.

A block name field 504 is a string of twenty characters which indicates the name of the design block containing the transistor that the transistor structure 500 pertains to. A block path field 505 is a string of forty characters which indicates the hierarchical path to the block containing the transistor that the transistor structure 500 pertains to. The instance name 506 is a twenty-five character string specifying the unique name of the transistor that the transistor structure 500 pertains to. The node names of the drain, gate, source, and bulk of the transistor are each specified in fifteen character strings 507–510.

A spice parameter field 511 is a string of ten characters which can be used to change the spice model to be applied to the transistor, if desired. A channel width field 512 is a floating point number specifying the channel width of the transistor. A channel length field 513 is a floating point number specifying the channel length of the transistor.

The component name 501 is a string of twenty-five characters representing the name of the type of transistor. Each unique transistor type has a unique component name 51 and a corresponding entry in the rule file 1407. An M Factor field 514 is a string of fifteen characters which represents how many transistors of the type specified by the transistor structure 500 are put in parallel in the circuit netlist.

A next transistor pointer 515 is included in the transistor structure 500 to facilitate the formation of the transistor linked list 300. The final transistor structure 303 of the transistor linked list 300 has a null next transistor pointer 515. A rule pointer 502 is included in the transistor structure 500 to indicate which set of rules governs the operation of the transistor.

FIG. 7 illustrates the rule structure 701. The rule structure 701 includes a component name 705 which is a string of thirty characters which indicates the type of transistor to which the rules within the rule structure 701 should be applied. The rule structure 701 includes a first junction breakdown table 702 consisting of fifty entries which list the breakdown voltages Vbk which correspond to the various gate to first junction voltages for one of the source or drain of a particular transistor.

The rule structure 701 includes an oxide breakdown field 706 which is a floating point number indicating the voltage which will cause oxide breakdown if applied across the gate oxide of the transistor. Because there is only one gate oxide thickness for any given type of transistor, this is a single number rather than an array.

The rule structure 701 includes a second junction breakdown table 703 consisting of fifty entries which list the breakdown voltages Vbk which correspond to the various gate to second junction voltages for the other of the source or drain of a particular transistor. The rule structure 701 includes a punch through table 704 consisting of fifty entries which lists the breakdown voltages Vbk which correspond to the various channel lengths that the transistor may be fabricated to have. Three spare floating point positions are included for implementation of future rules. Finally, the rule structure 701 includes a pointer to the next rule, so as to support the formation of a rule linked list 600.

Figure 2:
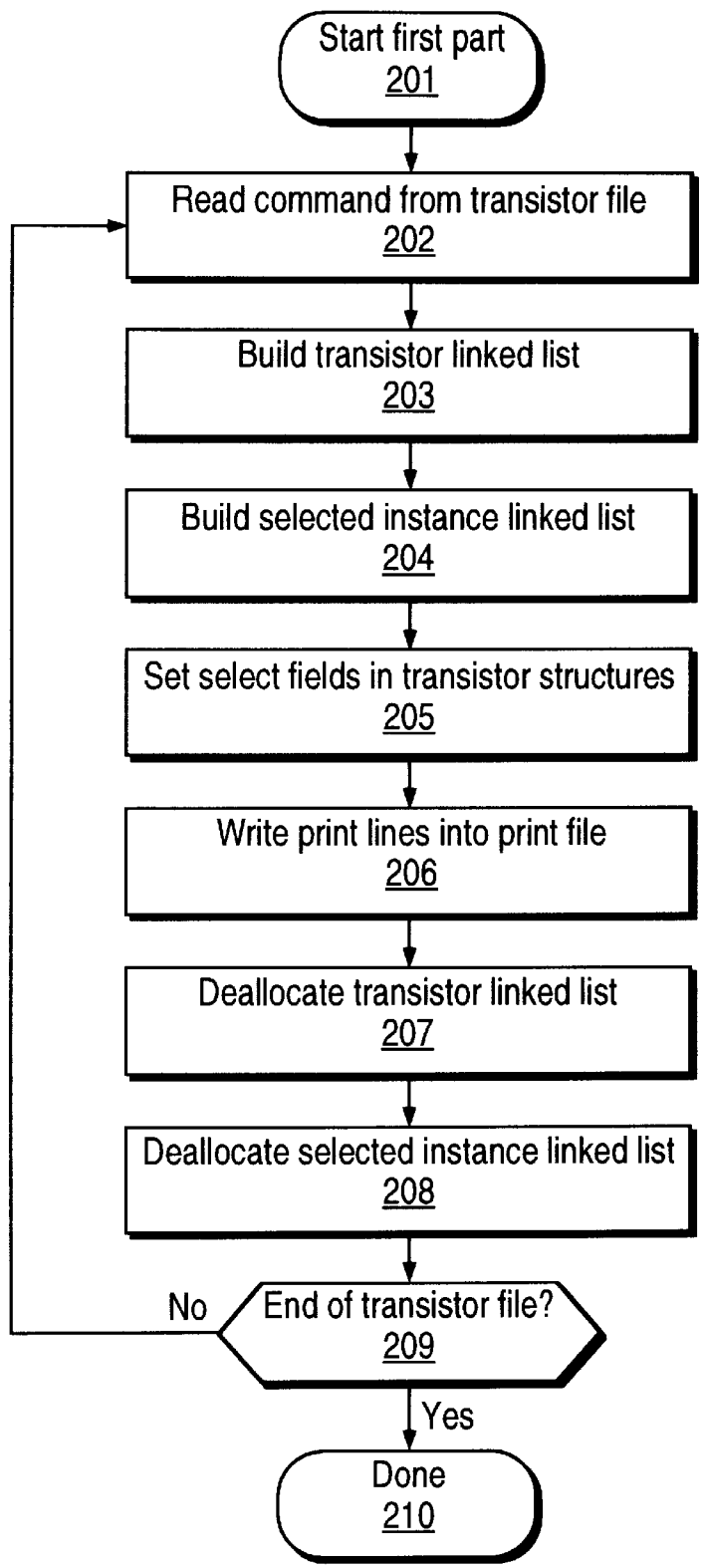
FIG. 2 is a flow chart showing the first part of the high voltage check program for generating a print file for a circuit simulator according to the present invention.
Figure 3:
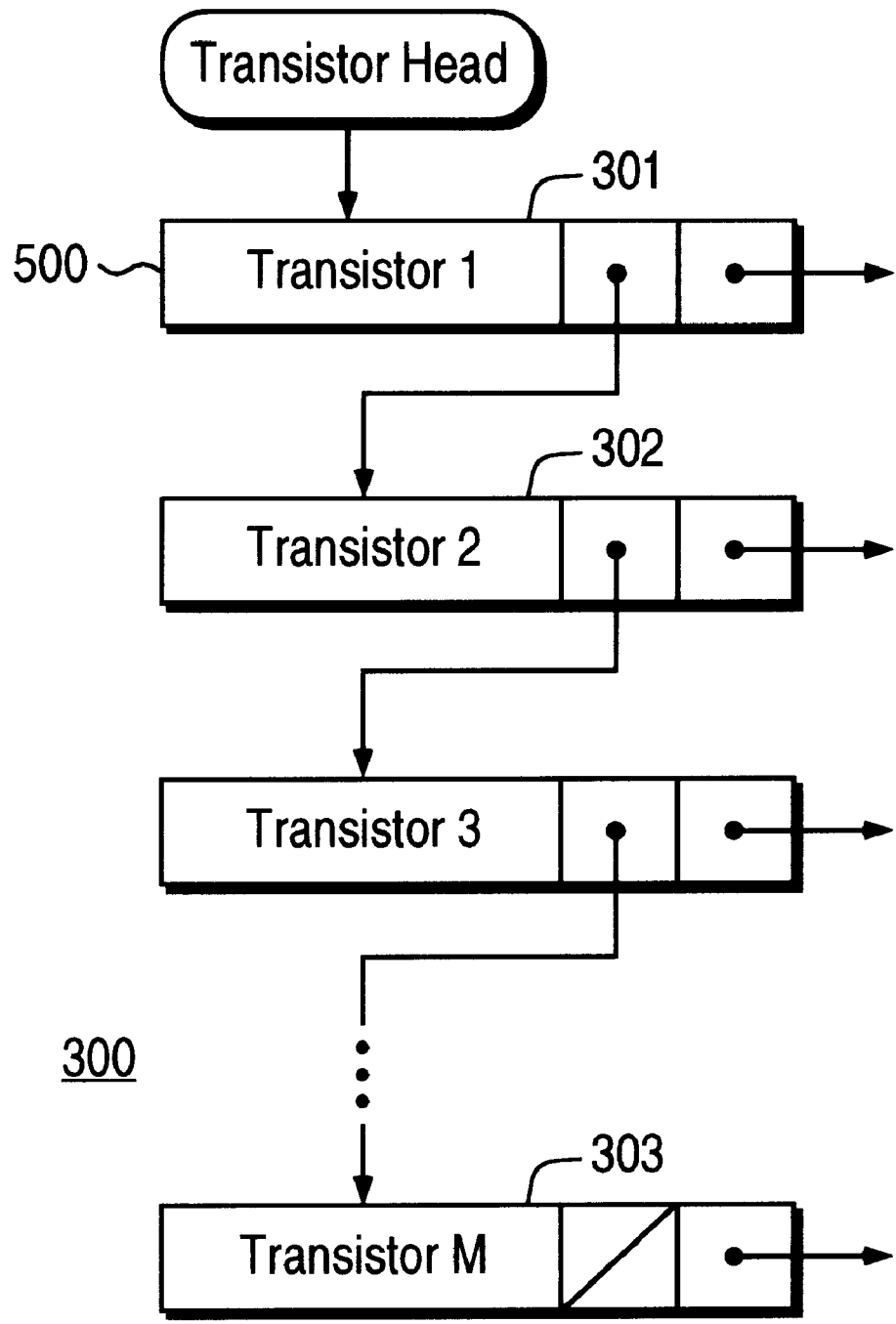
FIG. 3 illustrates a transistor linked list of transistor structures such as generated in the first and second parts of the high voltage check program according to the present invention.

FIG. 2 illustrates the method carried out by the first part. The first part 1401 of the high voltage check program according to the present invention creates a print file 1404 which is used as input to the spice simulator 1405. In order to accomplish the writing of the print file, upon invocation at step 201 the first part 1401 begins by reading a command at step 202 from the transistor file 1402. A command is a series of symbols beginning with the symbol "BLOCK_NAME". The next element of each command in the transistor file 1402 is a block path describing a block to be checked for high voltage violations. Optionally, one or more individual transistor instance names may be listed following the block path which indicate individual transistors within a block which are to be check for high voltage rule violations.

If individual transistors are specified, then only those transistors within the block are checked for high voltage rule violations. The following series of commands is an example of a transistor file 1402.

| | |
|---|---|
| BLOCK_NAME | allchip.xb3 |
| BLOCK_NAME | allchip.xb3.XI1995 |
| BLOCK_NAME | allchip.xb4 |
| MNI5122 | MPI5167 |
| MII9130 | |

A block may contain individual transistors and other blocks. In the above example, "allchip.xb3" is a block path; all transistors within the block will be checked. Transistors within blocks contained in "allchip.xb3" are not automatically checked, but rather must be specified for checking by separate commands. For example, the next command specifies "allchip.xb3.XI1995" as another block within which all transistors will be checked; this block happens to be within the block "allchip.xb3", as evidenced by the fact that "allchip.xb3" is the prefix in the block path name "allchip.xb3.XI1995". The command specifying "allchip.xb4" also includes optional individual transistor names, therefore only the three individual transistors whose instance names are "MNI5122", "MPI5167", and "MII9130" will be checked for high voltage rule check violations with the block "allchip.xb4". All other transistors within the block "allchip.xb4" will not be checked.

In order to build the transistor linked list at step 203, the high voltage check program according to the present invention reads the net list file 1403, searching for each instance name 506 to identify the names of the transistor drain, gate, source and bulk. The net list file 1403 is also used to create the print file 1404.

The transistor file 1402 consists of a list of blocks and individual transistors within blocks which are targeted for high voltage rule checking. Frequently, a simulation involves a very large circuit, where only a small part of the circuit is a potential candidate for having high voltage rule check violations. For example, a circuit might have low level digital portions which cannot possibly violate the high voltage rules. As another example, an integrated circuit may have high voltage portions which have already been verified to not violate the high voltage rules. Thus, it is unnecessary to check those blocks again. Therefore, the transistor file 1402 allows the user to specify exactly which parts of the integrated circuit to test for high voltage rule violations.

If a block name is specified, then the transistors within the block are checked. If a block name and individual transistor instance names are included, such as shown in the previous example with regard to block name allchip.xb4, then the specific instance names recited in the block name will be checked for high voltage violations but other transistors within that block will not be checked. Block names are specified by providing the path to the block. For example, in the example above, allchip.xb3 is a block name; allchip.xb3.XI1995 is a different block name which happens to be under allchip.xb3.

After reading a command from the transistor file 1402, the first part 1401 builds a transistor linked list at step 203 of all transistors within the block specified by the block path. The first part 1401 searches the net list file 1403 to find all the transistors in the block identified by the block path in the command of the transistor file 1402. These transistors are linked together to form a transistor linked list 300 corresponding to the block specified by the block path shown in the command of the transistor file 1402. Finding the correct block within the netlist file 1403 is accomplished by searching for the block name in the net list file 1402 behind the symbol ".SUBCKT". The transistor instance names are all symbols at the beginning of a line that begin with the character "M". The end of the block is specified by the symbol ".ENDS". The following lines show an example of a portion of a net list file 1403.

```
.SUBCKT xdec_tc
+ SG1 WLJ0 WLJ1 WLJ2 WLJ4 WLJ5 WLJ6 WLJ7 ERMODE
ERMODEB HVMODE SEL
+ SELD VPP1DXDEC VPP1PAD VPP1SELD VPP1XDEC VPP2XDEC
VVERX XTO XT1 XT2
DMI3912 VSS SELD WJHCHL AREA=180 PJ=30
DMI5804 VSS VPP1SELD WJHCHL AREA=225 PJ=30
.ENDS $ xdec_tc $
.SUBCKT pgmon_tc
+ PGMON CLOCKB LV_XT MV_XT PGMHTRBM VPP1XT
MNI1111_N PGMHTRBB PGMHTRBM VSS VSS NE 3 0.7 $NMOS4
MPI1111_P VCC PGMHTRBM PGMHTRBB VCC PE 6 0.8 $PMOS4
MP#211 N2064 N1047 VCC VCC PE 16 0.8 $PMOS4
MN#212 N2064 N1047 1685_N1810 VSS NE 16 0.7 $NXFR
.ENDS $ pgmon_tc $
.SUBCKT blcontrol_tc
+ BLCONTROL VPP1PAD
RMI2704 BLCONTROL VPP1PAD 100 TC1=TCP21 TC2=TCP22
SCALE=RP2
.ENDS $ blcontrol_tc $
```

The block path and the block name are not the same. For example, a block path, such as "allchip.xb3" could correspond to a block name such as "hvrxdec_tc". The first part 1401 finds the mapping from the block path to the block name by searching for the block path within the netlist file 1403. Both the block name 504 and the block path 505 are written into the transistor structure 500 in the transistor linked list 300.

For each command line in the transistor file 1402, at step 204 the first part 1401 also builds a selected instance linked list 400 which includes the instance names of the individual transistors which have been individually specified for checking. If no individual transistors are included in the command line (as is the case for the first two command lines in the example shown above), the selected instance linked list 400 is null.

At step 205, if the selected instance linked list 400 is null, then the select field 516 in each transistor structure of the transistor linked list 300 is set to a non-zero value to indicate that the transistor is selected. If the selected instance linked list 400 is not null, then at step only the select fields 516 of transistors having transistor instance names which appear in the selected instance list 400 are set to a non-zero value. In this way, all transistors are selected unless the user specifies individual transistors.

At step 206, the first part 1401 then writes the print file lines for the block into the print file 1404. A print line is included for each transistor structure 500 which had a select field 516 which was set to a non-zero value. The print line instructs the circuit simulator (spice) which will be run later to print out the node voltages of the drain, gate, source, and bulk of each transistor. An example of a print file 1404 is shown below.

```
$$ BLOCK: hvrxdec_tc     Path: allchip.xb3     $$
.print  v(xb3.D) v(xb3.F) v(VCC) v(VSS) $NMOS 2
.print  v(VSS) v(VSS) v(VSS) v(VSS) $IMOSHVHD 40
.print  v(xb3.A) v(xb3.VPT12) v(xb3.VPP2XDEC) v(VSS)
$IMOSHVHD 20
.print  v(VSS) v(VSS) v(VSS) v(VSS) $IMOSHVHD 8
.print  v(VSS) v(VSS) v(VSS) v(VSS) $IMOSSD 8
.print  v(xb3.C) v(xb3.VPT12) v(xb3.VPP2XDEC) V(VSS)
$IMOSHVHD 4
.print  v(VSS) v(VSS) v(VSS) v(VSS) $IMOSSD 40
.print  v(xb3.A) v(xb3.VPT9) v(xb3.B) v(VSS) $IMOSSD 20
.print  v(xb3.B) v(xb3.E) v(VCC) v(VSS) $NMOS 10
.print  v(xb3.C) v(xb3.VPT9) v(xb3.D) v(VSS) $IMOSSD 4
$$ BLOCK: predischg_tc  Path: allchip.xb3.XI1995    $$
.print  v(xb3.XI1995.B) v(xb3.XI1995 .VPT14) v(xb3.XI1995 .A)
v(VSS)     $IMOSHVHD2
.print  v(xb3.XI1995.E) v(xb3.XI1995.PREDIS)
v(xb3.XI1995.V45PAD)     v(VSS)     $IMOSSD 2
.print  v(xb3.XI1995.VPT6) v(xb3.XI1995.VPT6)
v(xb3.XI1995.E)     v(VSS) $IMOSDDHVTC 3
.print  v(xb3.XI1995.D) v(VCC) v(xb3.XI1995.E)
v(xb3.XI1995.VPT105)     $PMOSDD 2
.print  v(xb3.XI1995.VPP2I) v(xb3.XI1995.VPT9)
v(xb3.XI1995.A)     v(xb3.XI1995.VPP2PAD)     $PMOSDD
.print  v(xb3 .XI1995 .VPT6) v(xb3 .XI1995 .VPT6)
v(xb3.XI1995.D)     v(VSS) $IMOSDDHVTC 3
.print  v(xb3 .XI1995 .VPT9) v(xb3 .XI1995 .VPT9)
v(xb3.XI1995.A)     v(VSS) $IMOSDDHVTC 3
.print  v(xb3.XI1995.C) v(xb3.XI1995.VPT10S) v(xb3.XI1995.D)
v(VSS)     $IMOSDD 2
.print  v(xb3.XI1995.B) v(xb3.XI1995.VPT6) v(xb3.XI1995.C)
v(xb3.XI1995.VPT14)     $PMOSDD 2
$$ BLOCK: vppixdec_tc     Path: allchip.xb4     $$
.print  v(xb4.B) v(xb4.VPP2XDEC) v(xb4.C) v(VSS) $NMOSDD 1.5
.print  v(xb4.VPP2XDEC) v(xb4.DIV) v(xb4.DIV)
v(xb4.VPP2XDEC)     $PMOS4 2
.print  v(xb4.VPP2XDEC) v(xb4.DIV) v(xb4.DIV) v(VSS)
$IMOSHVDD 3
```

In the above example, the print lines for the transistors of three different blocks are specified. The portion of the print file 1404 shown above corresponds to the transistor file 1402 shown above. The first portion of the print file 1404 corresponds to the block name "hvrxdec_tc" which corresponds to the block path "allchip.xb3". The second portion of the print file 1404 corresponds to the block name "predischg_tc" which corresponds to the block path "allchip.xb3.XI1995". The third portion of the print file 1404 corresponds to the block name "vpplxdec_tc" which corresponds to the block path "allchip.xb4". Because the transistor file command corresponding to block path "allchip.xb4" included individual transistors to be marked as selected for high voltage rule checking, there are only three print lines which correspond to the three selected transistors MNI5122, MPI5167, and MII9130.

The print file lines include a ".print" statement followed by four "v(node)" statements and a comment section following a dollar sign ("$") which includes the component name and transistor channel length. For example, in the last line of the print file shown above, the component name of the transistor MII9130 within block path "allchip.xb4" is "IMOSHVDD", and it has a channel length of 3. The component name specifies the type of transistor; there is a separate set of rules for each unique component name. The drain, gate, source, and bulk node names are listed in the "v(node)" statements in each print line. For example, the drain of transistor MNII9130 is "xb4.VPP2XDEC". These node names are written into the print file 1404 from the transistor structures, and were written into the transistor structures by searching in the netlist file 1403.

After the print file lines have been written for a block path specified in a command of the transistor file 1402, the selected instance linked list 400 and the transistor linked list 300 are deallocated at steps 208 and 207, respectively. The first part 1401 then proceeds to the next line in the transistor file 1402. By deallocating the selected instance linked list 400 and the transistor linked list 300, memory is conserved; only one command at a time is processed.

If any other lines are determined by step 209 to exist in the transistor file, the first part returns to step 202 to read the next line. When all commands of the transistor file 1402 have been processed by the first part 1401, the first part 1401 is done at step 210. The final output of the first part 1401 is the print file.

After running the first part 1401, the user then invokes spice to run the circuit simulation which takes the print file as input. The output of the spice simulation is a spice output file 1406.

The second part 1408 of the high voltage rule check program according to the present invention examines the spice output file 1406 to check for high voltage rule violations. As input, the second part 1408 of the high voltage check program according to the present invention uses the print file 1402, the spice output file 1406, and the rule file 1407. The second part 1408 of the high voltage check program reads the rule file 1407 in order to build the rule linked list 600. The rule file 1407 is written by the user. An example of a rule file 1407 is shown below.

| Tolerance(v) 1) | (0.1) |
|---|---|
| ComponentName | $NMOSSD |
| Junction1Breakdown | (0,10) (2,12) (5,14) |
| GateoxideBreakdown (Inversion) | (10) |
| Junction2Breakdown | (0,10) |
| PunchThrough 2) | (0,0) (0.7,7) (1,10) |
| ComponentName | $NMOSSD |
| Junction1Breakdown | (0,10) (2,12) (5,14) |
| GateoxideBreakdown (Inversion) | (10) |
| Junction2Breakdown | (0,10) (2,12) (5,14) |
| PunchThrough 3) | (0,0) (0.7,7) (1,10) |
| ComponentName | $IMOSSD |
| Junction1Breakdown | (0,10) (2,12) (5,16) |
| GateoxideBreakdown (Inversion) | (10) |
| Junction2Breakdown | (0,10) |
| PunchThrough 4) | (0,0) (0.7,7) (1,10) |
| ComponentName | $IMOSSD |
| Junction1Breakdown | (0,10) (2,12) (5,16) |
| GateOxideBreakdown (Inversion) | (10) |
| Junction2Breakdown | (0,10) (2,12) (5,16) |
| PunchThrough 5) | (0,0) (0.7,7) (1,10) |
| ComponentName | $IMOSHVSD |
| Junction1Breakdown | (0,10) (2,12) (5,16) (9,18) |
| GateOxideBreakdown (Inversion) | (10) |
| Junction2Breakdown | (0,10) |
| PunchThrough 6) | (0,0) (0.7,7) (1,10) |
| ComponentName | $TMOSHVHD |
| Junction1Breakdown | (0,10) (2,12) (5,16) |
| GateoxideBreakdown (Inversion) | (10) |
| Junction2Breakdown | (0,10) (2,12) (5,16) (9,18) |
| PunchThrough 7) | (0,0) (0.7,7) (1,10) |
| ComponentName | $IMOSHVDD |
| Junction1Breakdown | (0,10) (2,12) (5,16) (9,18) |
| GateOxideBreakdown (Inversion) | (10) |
| Junction2Breakdown | (0,10) (2,12) (5,16) (9,18) |
| PunchThrough | (0,0) (0.7,7) (1,10) |

The rule file 1407 includes a tolerance voltage which specifies that a rule is not deemed to be broken until the potential between two nodes exceeds the breakdown voltage plus the tolerance voltage. Thus, for example, if the oxide breakdown voltage is 10 V and the tolerance voltage is 0.1 V, then the gate to first junction voltage must exceed 10.1 V in order for a rule violation to be reported because of the potential between the gate and the first junction. The rule file 1407 includes a "ComponentName" field which specifies the type of transistor that the rule applies to. For example, in the above rule file 1407, the seventh rule corresponds to transistors of the type "$IMOSHVDD".

Each rule within the rule file 1407 includes a "Junction1Breakdown" field which specifies the junction breakdown voltages for the first junction which correspond to various gate to bulk voltages. The first junction is either the source or the drain; the second junction is the other of the source and the drain. The first breakdown voltages are expressed as a series of pairs of gate to bulk voltages and first junction to bulk voltages in the form (Vgb, Vbk), where Vgb is the gate to bulk voltage, and Vbk is the breakdown voltage for the first junction to bulk. Anywhere from one to fifty pairs may be included. From among all the pairs, during any single check of a given transistor at a given time, only one of the first junction to bulk voltages serves as the first junction breakdown voltage for the rule check; the first junction breakdown voltage used for the rule check is determined by the gate to bulk voltage existing at the transistor at the given time.

The first junction to bulk voltage which serves as the first junction breakdown voltage for a violation check of a given transistor at a given time is the first junction to bulk voltage which corresponds to the highest gate to bulk voltage that is less than the gate to bulk voltage that exists at the given transistor at the given time. For example, when the transistor of the type specified by rule (7) above has a gate to bulk voltage of 2.1 volts, then the first junction breakdown voltage is 12 volts; and if the gate to bulk voltage is less than 2 volts, then the first junction breakdown voltage is 10 volts.

Each rule within the rule file 1407 includes a "GateOxideBreakdown" field which indicates the maximum voltage which can exist across the gate oxide layer of a transistor of the type governed by the rule. Because the gate oxide extends over a portion of the drain, bulk, and source, the gate to first junction voltage (Vgj1) and the gate to second junction voltage (Vgj2) are checked against the gate oxide breakdown voltage. If transistor is in accumulation mode, then the gate to bulk voltage (Vgb) is also checked against the oxide breakdown voltage.

Each rule within the rule file 1407 includes a "Junction2Breakdown" field which specifies the junction breakdown voltages of the second junction which correspond to various gate to bulk voltages. These breakdown voltages are expressed the same way as the first junction breakdown voltages, and the tests for violations are carried out in the same way.

Each rule within the rule file 1407 includes a "Punch-Through" field which specifies the maximum voltage which can exist from the drain to source or source to drain of any given transistor of the type governed by the rule. The punch through breakdown voltages are expressed as a series of pairs of channel lengths and differences between the first junction and second junction voltages in the form (ChL, Vds), where ChL is the channel length in microns, and Vds is the first junction to second junction voltage. Anywhere from one to fifty pairs may be included. From among all the pairs, during any single check of a given transistor, only one of the pairs from the series is chosen depending upon the channel length. The punch through breakdown voltage used for the rule check is determined by the channel length of the transistor being checked.

The first junction to second junction voltage which serves as the punch through breakdown voltage for a violation check of a given transistor is the breakdown voltage in the pair which corresponds to the highest channel length that is not greater than the channel length of the given transistor. For example, when the transistor of the type specified by rule (7) above has a channel length of 0.8 microns, then the punch through breakdown voltage is 7 volts; alternatively if the channel length is 2 microns, then the punch through breakdown voltage is 10 volts.

The user may specify as many rules as desired in the rule file 1407. If a large number of different transistor types are included in the design to be checked, a large number of corresponding rules must necessarily exist in the rule file 1407.

Figure 8:
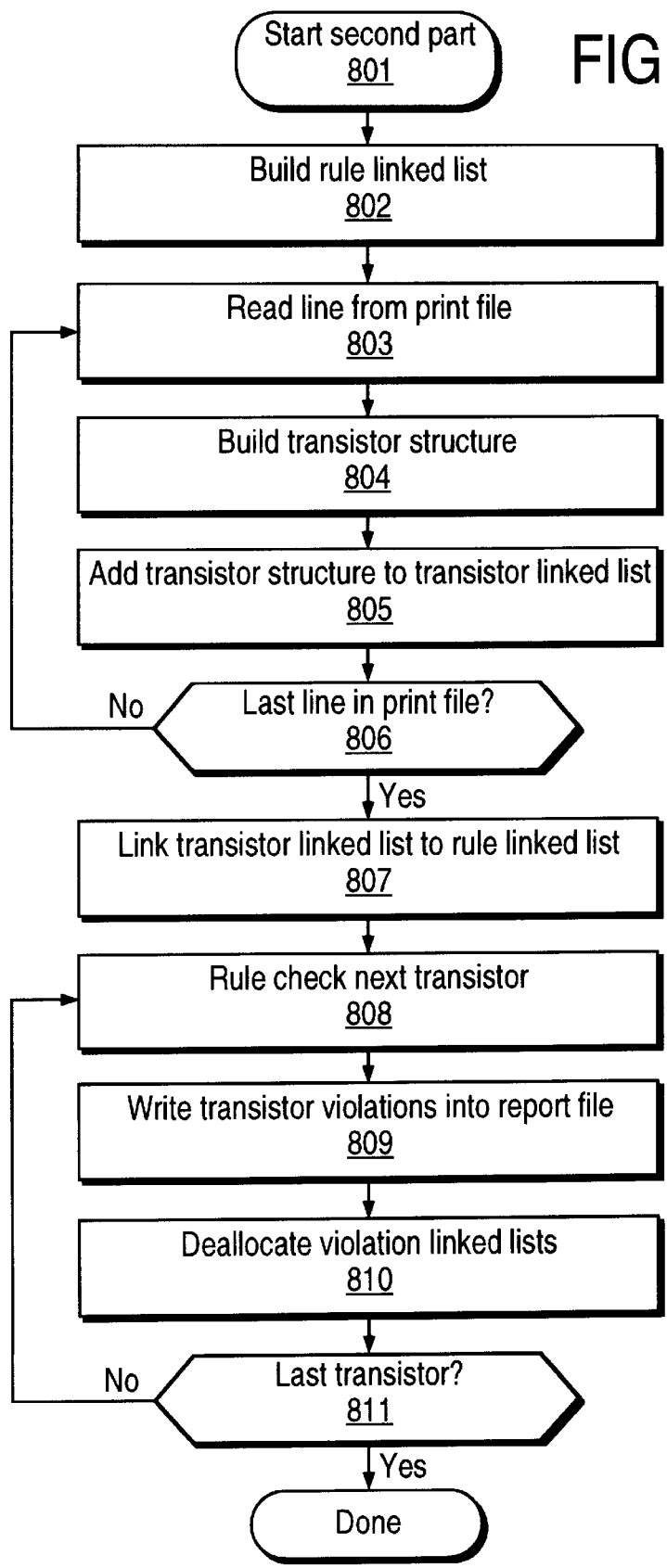
FIG. 8 is a flow chart illustrating the second part of the high voltage check program for analyzing the output of a circuit simulator according to the present invention.

FIG. 8 illustrates the steps carried out by the second part according to the present invention. When the second part is invoked at Step 801, the second part 1408 reads the rule file 1407 and creates a rule linked list 600 at step 802. The second part 1408 of the high voltage check program reads the print file 1404 at step 803 to build the transistor linked list 300 corresponding to the selected transistors of the hierarchical design. Each line in the print file corresponds to a selected transistor, thus there is no need for a selected instance linked list 400 in the second part. Each transistor is built in step 804 by inserting the data found in the line of the print file corresponding to the transistor into a transistor structure. Any information within the transistor structure which is not available in the line of the print file is left blank. The transistor structure is added to the transistor structure lined list at step 805. At step 806, if the there are more lines in the print file, the method of the second part reverts back to step 803; otherwise, the method continues on to step 807. The high voltage check program links the transistor linked list 300 to the rule linked list 600 at step 807. For each transistor in the transistor linked list 300, the component name 501 of the transistor structure 500 is compared to the component name 705 corresponding to the rule structure 701. When a match is found between the component name 501 of the transistor structure 500 and the component name 705 of a rule structure 701, a pointer 502 to the rule structure 701 is written into the transistor structure 500.

Although in the preferred embodiment the second part produces a transistor linked list containing all transistors which are to be checked, in an alternative embodiment the second part produces a transistor linked list on a block by block basis. In this alternative embodiment, for each block, the building of the transistor linked list can be performed in the same way as for the first part using the transistor file and netlist file, or alternatively can be performed using the block identification present in the print file.

The first part 1401 of the high voltage check program according to the present invention wrote the print file 1404 so that SPICE was instructed to write all the node voltages relevant to each specific transistor for the entire simulation of each transistor into a contiguous portion of the spice output file 1406. This allows the second part 1408 of the high voltage check program to search for the rule violations for a specific transistor quickly and thoroughly while maintaining only a small portion of the spice output file 1406 in DRAM 102 at any given time. Because the spice output data for a given transistor is all located together within the spice output file 1406, the pages of memory containing the data pertaining to the transistor currently being checked may be stored in DRAM 102 while the remainder of the spice output file 1406 is paged out to secondary storage 103. This speeds up the rule checking because once the proper pages of memory are retrieved for a given transistor, the entire simulation regarding that transistor can be checked without incurring the time delay required for numerous secondary memory 103 transactions.

As described above, the second part 1408 operates on all the transistors within the design.

For each transistor structure 500 in the transistor linked list 300, the pointer to the corresponding rule structure 701 is assigned by searching for the appropriate rule structure 701 within the rule linked list 600 which has a component name 705 that matches the component name in the component name field 501 of the transistor structure 500.

The second part 1408 of the high voltage rule check program forms the transistor linked list by reading all the lines of the print file. When the end of the print file has been reached, the transistor linked list 300 is ended by inserting a null into the next transistor pointer 515 of the last transistor structure 500.

Figure 9:
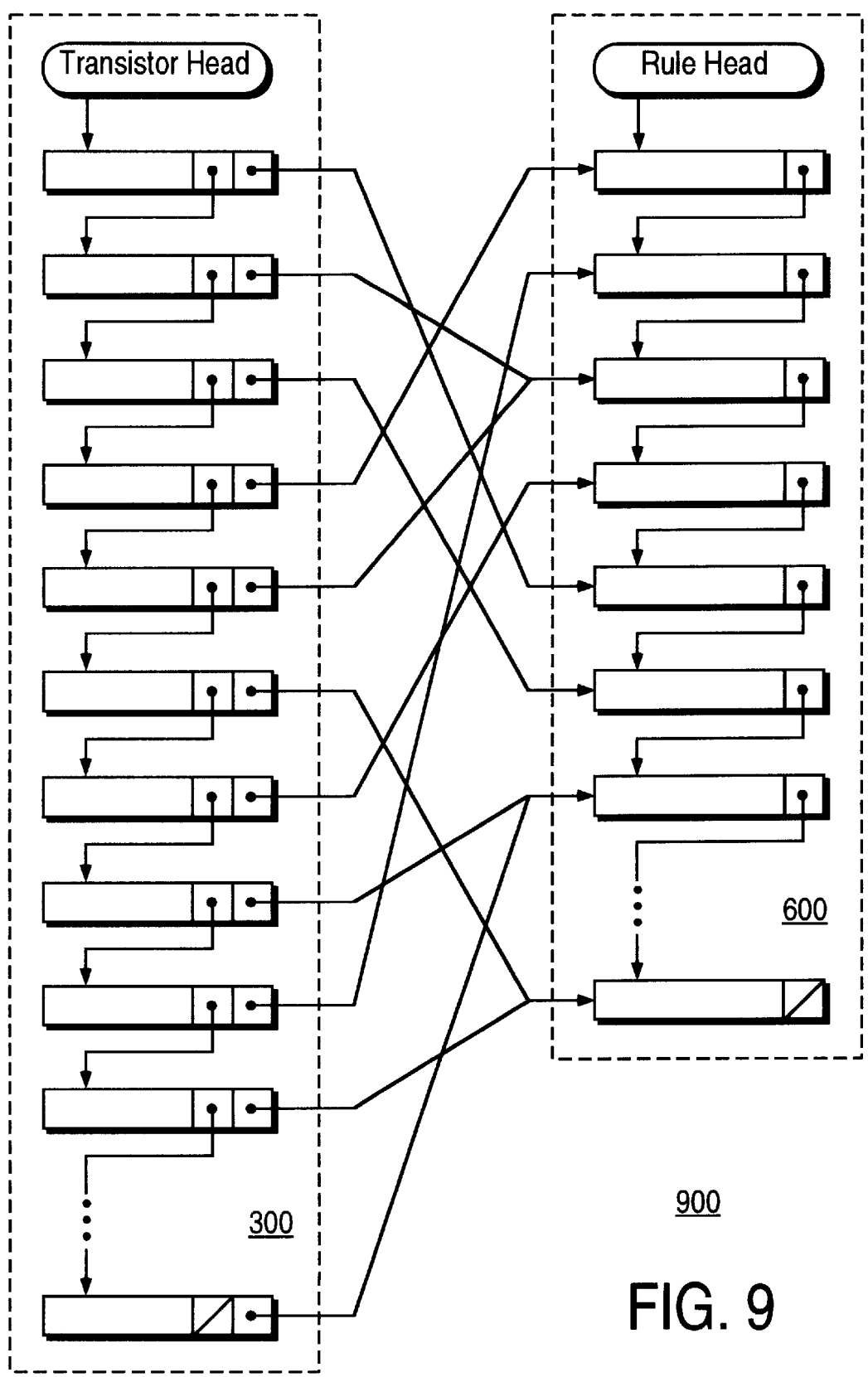
FIG. 9 illustrates the transistor linked list which is linked to the rule linked list as generated by the second part of the high voltage check program according to the present invention.

When the transistor-rule linked list 900 illustrated in FIG. 9 is complete for the selected transistors of the entire design, the program begins checking for high voltage violations at step 808. For each transistor, a separate violation report entry is generated. An example of such as report entry is shown below.

```
**** Design Rule Violation for transistor ****
$PMOS4      b      v25      vss      vpt9
Block name: voltsrc_tc Block path: allchip.xB5
Rule used: Rule for $PMOS4,      Channel Length = 1.2
@@ Junction 2 Breakdown Violation @@
Start at t = 1.7940e-05       (VG,VJ1,VJ2,VB) = (2.76), 6.249, 0, 10.1)
Stop at t = 2.2506e-05        (VG,VJ1,VJ2,VB) = (2.768, 6.254, 0, 1013)
Start at t = 2.2516e-05       (VG,VJ1,VJ2,VB) = (2.774, 6.24, 0, 10.11)
Stop at t = 2.2716e-05        (VG,VJ1,VJ2,VB) = (2.76, 6.198, 0, 10.1)
Start at t = 2.2724e-05       (VG,VJ1,VJ2,VB) = (2.776, 6.215, 0, 10.1)
Stop at t = 2.3686e-05        (VG,VJ1,VJ2,VB) = (2.771, 6.248, 0, 10.13)
Start at t = 2.3694e-05       (VG,VJ1,VJ2,VB) = (2.781, 6.235, 0, 10.12)
Stop at t = 2.3916e-05        (VG,VJ1,VJ2,VB) = (2.779, 6.238, 0, 10.12)
Start at t = 2.3928e-05       (VG,VJ1,VJ2,VB) = (2.781, 6,227, 0, 10.11)
```

-continued

| | |
|---|---|
| Stop at t = 4.0006e-05 10.16) | (VG,VJ1,VJ2,VB) = (2.776, 6.292, 0, |
| Start at t = 4.0016e-05 10.1) | (VG,VJ1,VJ2,VB) = (2.765, 6.244, 0, |
| Stop at t = 4.0334e-05 10.14) | (VG,VJ1,VJ2,VB) = (2.77, 6.285, 0, |
| Start at t = 4.0338e-05 10.1) | (VG,VJ1,VJ2,VB) = (2.792, 6.195, 0, |
| Stop at t = 4.1246e-05 10.11) | (VG,VJ1,VJ2,VB) = (2.772, 6.234, 0, |
| Start at t = 4.1258e-05 10.1) | (VG,VJ1,VJ2,VB) = (2.776, 6.211, 0, |
| Stop at t = 4.1298e-05 10.1) | (VG,VJ1,VJ2,VB) = (2.774, 6.215, 0, |
| Start at t = 4.1304e-05 10.1) | (VG,VJ1,VJ2,VB) = (2.773, 6.218, 0, |
| Stop at t = 4.1340e-05 10.11) | (VG,VJ1,VJ2,VB) = (2.763, 6.236, 0, |
| Start at t = 4.1370e-05 10.1) | (VG,VJ1,VJ2,VB) = (2.772, 6.227, 0, |
| Stop at t = 4.1684e-05 10.14) | (VG,VJ1,VJ2,VB) = (2.771, 6.286, 0, |
| Start at t = 4.1690e-05 10.15) | (VG,VJ1,VJ2,VB) = (2.794, 6.246, 0, |
| Stop at t = 4.3622e-05 10.1) | (VG,VJ1,VJ2,VB) = (2.775, 6.214, 0, |
| Start at t = 4.3638e-05 10.1) | (VG,VJ1,VJ2,VB) = (2.772, 6.224, 0, |
| Stop at t = 6.3025e-05 10.1) | (VG,VJ1,VJ2,VB) = (2.761, 6.249, 0, |

//*\\ Maximum junction violation amount exceeding rule 0.229999V at time 4.1698e-05

The print file directed spice to organize its output file in a way that is optimal for rule checking. The spice output file 1406 contains the node voltages for each transistor from the beginning of the simulation to the end of the simulation organized by transistor. For example, each line of the spice output file 1406 contains all the node voltages for a specific transistor at a specific time, and all lines corresponding to the specific transistor are group together and are ordered from the beginning time to the end time of the simulation.

Figure 10:
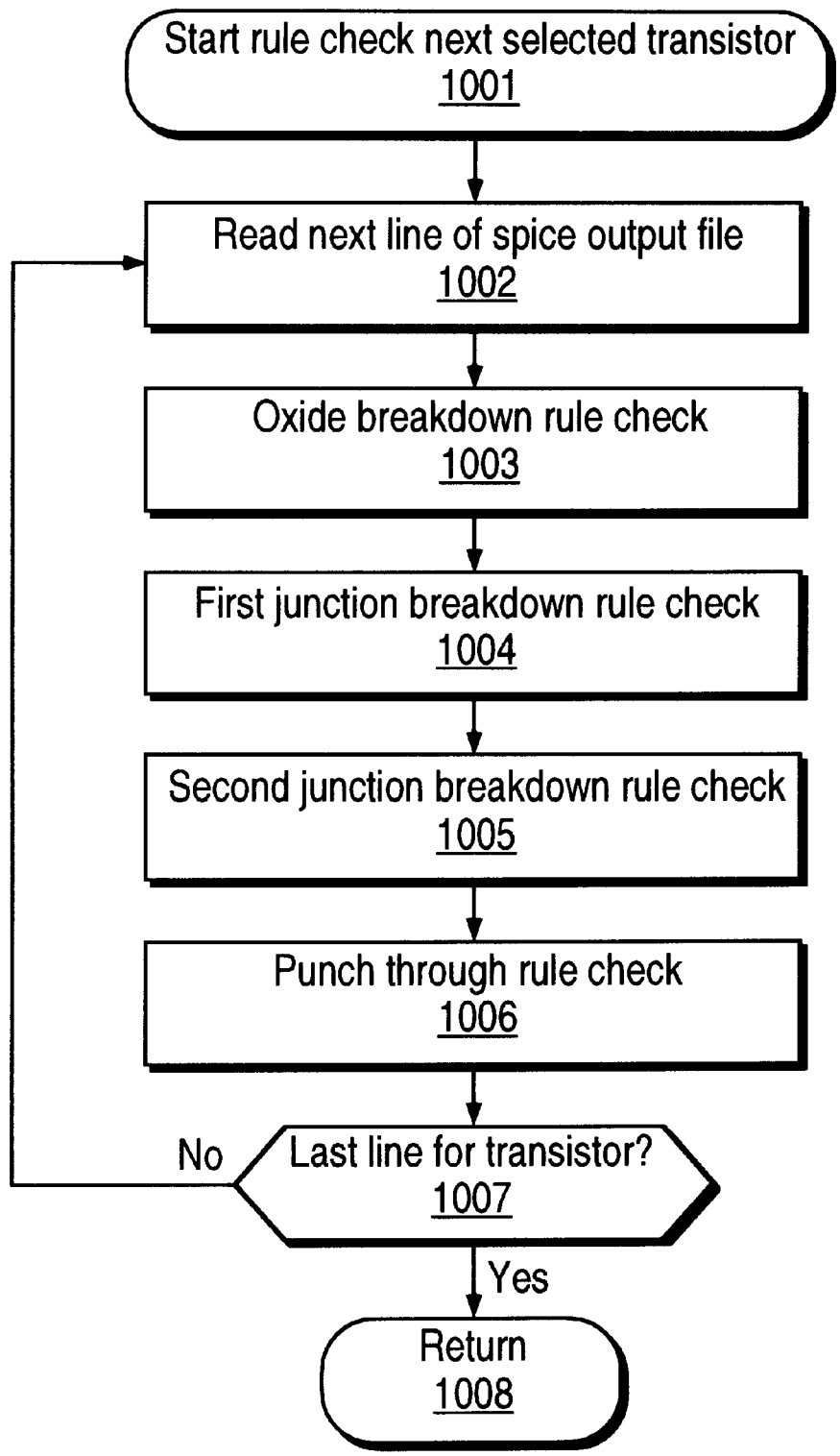
FIG. 10 is a flow chart illustrating a method for carrying out rule checking on a transistor during the second part of the high voltage check program according to the present invention.

When the spice output file 1406 is analyzed by the high voltage rule check software according to the present invention at step 808, each time point pertaining to a given transistor is tested for compliance with all of the high voltage violation types listed in the rule definition pertaining to the transistor component name, as illustrated in FIG. 10 by steps 1003–1006. Each time step 808 is reached, the flow chart illustrated in FIG. 10 is executed.

Figure 12:
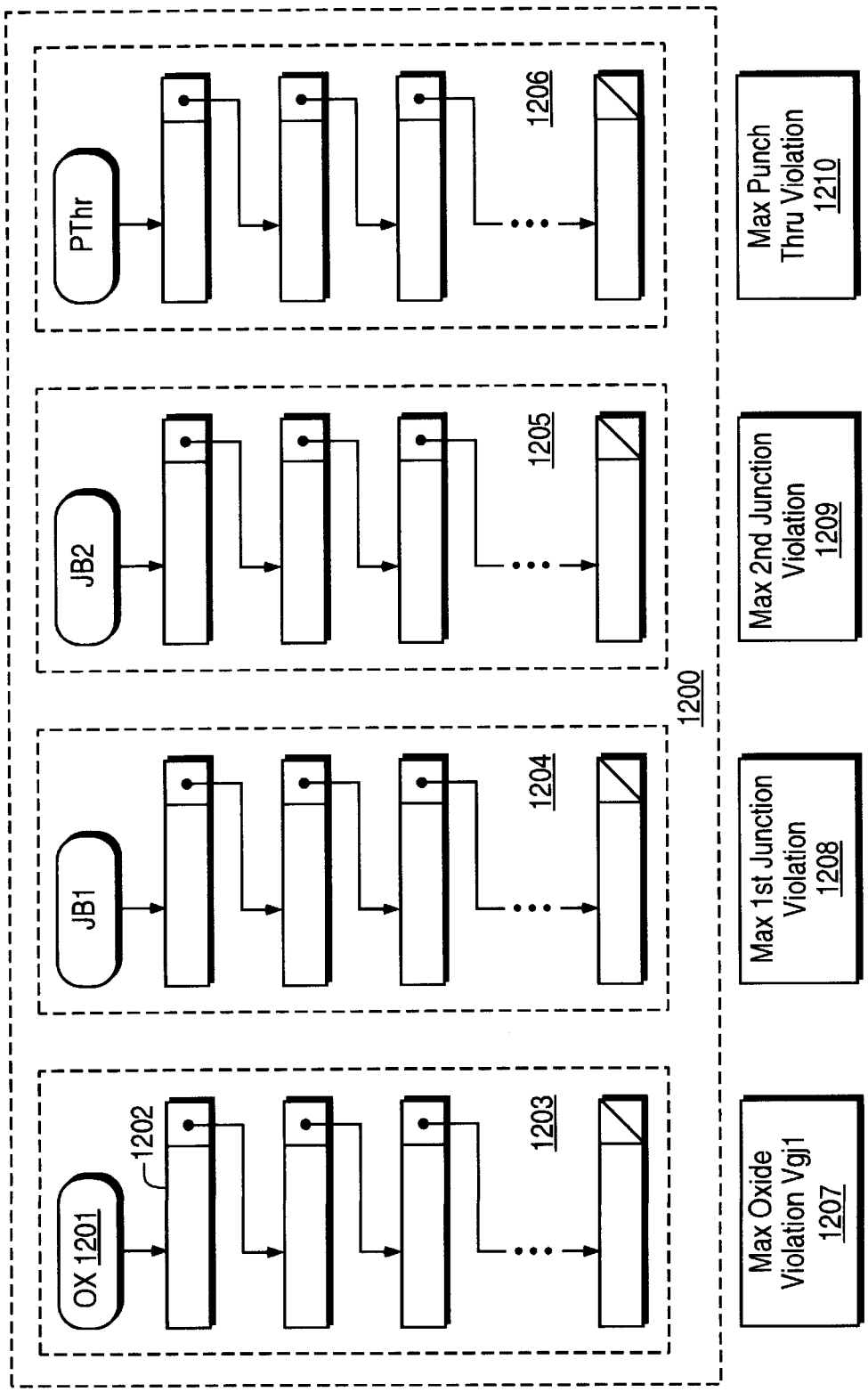
FIG. 12 illustrates four maximum violation variables and four violation linked lists (an oxide breakdown violation linked list, a first junction breakdown violation linked list, a second junction breakdown violation linked list, and a punch through violation linked list) corresponding to the four types of high voltage violations checked for during the checking of an individual transistor during the second part of the high voltage rule check program according to the present invention.

Each type of high voltage violation type has a corresponding rule violation output linked list, which is illustrated in FIG. 12. For example, the oxide breakdown rule has an oxide head pointer 1201 which points to the first occurrence 1202 of a rule violation of the oxide breakdown rule. As described in the rule structure 701 above, there are currently four types of high voltage violations which are checked for. These are oxide breakdown, first junction breakdown, second junction breakdown, and punch through. There is no limitation according to the present invention that these four violations be the only ones which are looked for, and indeed the current rule structure 701 includes three spare floating point spaces for future rules which may need to be checked for at some other time when the future transistor structures require additional types of violation checks.

In order to report the rule violations, a set of linked lists 1200 of violations is built. Each violation list a violation identifier 1301 which indicates whether this is the beginning or the end of a violation sequence. Each violation also includes the time 1302 and the drain, gate, source, and bulk voltages 1303–1306 at the particular time point at which the transistor being checked is found to be in violation.

For example, the oxide breakdown rule violation linked list 1203 consists of a series of elements indicating the start or end of a violation sequence, the time, and the transistor's node voltages at the times that there is found to be the beginning or end of a violation sequence. Rule violations typically occur in long strings of sequentially adjacent time points. For example, at any particular transistor node, if a particular node voltage is high enough to cause one of the rules to be in violation, then it is likely that during the next time period the particular node will also be in violation.

It is inconvenient to report every time point in which a violation occurs. For example, for a 100 nanosecond simulation where node voltages are computed each tenth of a nanosecond, it is not convenient for the user to view all time points having violations, because frequently many time sequential time points in a row will be in violation. For example, in a 100 nanosecond simulation, a certain transistor might have a first junction breakdown violation that begins at 10.5 nanoseconds and ends at 20 nanoseconds. In that case, if every time period in which a violation occurred were reported to the user, then ninety-five adjacent time periods would be reported to the user to report a single first junction breakdown event. This is inconvenient to the user, therefore the high voltage check program according to the present invention looks for the first occurrence of a particular type of rule violation and reports that the violation begins at that time period and then, when the violation is no longer found at that node, it reports the ending time for the rule violation. In this way, the above-mentioned example is reported to the user as a violation beginning at 10.5 nanoseconds and ending at 20 nanoseconds.

Each transistor in the transistor linked list 300 pertaining to the current block is checked for all four types of high voltage rule violations. For each transistor, each line of the spice output file 1406 pertaining to the transistor is analyzed for high voltage rule violations. Of the lines pertaining to a particular transistor, each line includes the drain, gate, source, and bulk voltages at a specific time. In checking each transistor, a violation linked list is formed for each type of violation. For example, an oxide breakdown violation linked list 1203, a first junction breakdown violation linked list 1204, a second junction breakdown violation linked list 1205, and a punch through violation linked list 1206 are formed.

Each simulation typically involves a large number of time steps. Frequently, when a violation occurs, there are a large number of sequential time steps during which the violation occurs. For example, when the gate to first junction voltage goes above the oxide breakdown voltage, the oxide breakdown rule is violated for every time step until the gate to first junction voltage goes back below the oxide breakdown voltage; this can easily be hundreds of time steps.

Instead of adding each one of these violations to one of the violation linked lists, and thereby using a large amount of memory, according to the present invention, only the beginning and ending times of violation sequences are reported. Thus, each entry in the violation linked lists includes an identification field indicating whether or not the time point reported is the beginning or end of a violation sequence. Each entry also includes a time field which records the time of the beginning or end of the violation sequence. Each entry also includes fields listing the drain, gate, source, and bulk voltages at the time. Each entry also includes a pointer to the next beginning or end of a violation sequence.

Figure 11:
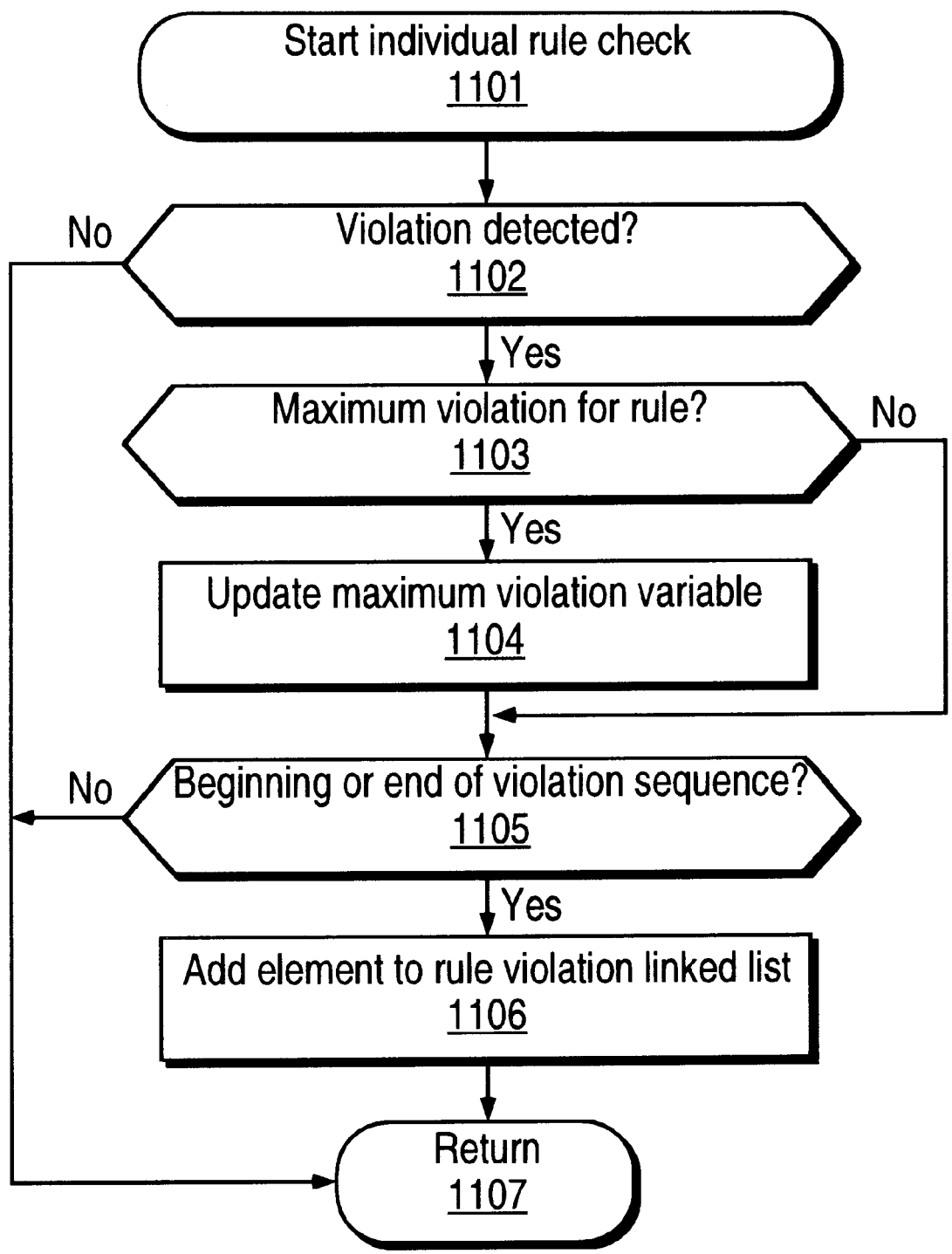
FIG. 11 is a flow chart illustrating a method for carrying out a single rule check on an individual simulator output line (such as occurs four times during one cycle through the loop shown in FIG. 10) during the second part of the high voltage check program according to the present invention.

FIG. 11 illustrates the steps involved in each of the rule checks shown in steps 1003–1006. Whenever any of the rule checks in steps 1003–1006 are reached, the method of FIG. 11 is invoked at step 1101.

The detection of the violation at step 1102 is performed by applying the particular tests pertaining to the appropriate one of the four rule violation types. If no violation is detected, the method of FIG. 11 returns to the method of FIG. 10.

However, according to the present invention, for each transistor and each violation type, the maximum value of the violation amount and the time of the maximum violation are recorded and reported to the user. When a violation is detected at step 1101, the method tests at step 1103 to see if the present violation exceeds the maximum violation already recorded for the rule. To accomplish this, for each of the four violation types, a maximum violation variable 1207–1210 stores the amount of the maximum value of the violation amount seen so far. Each time step that a violation is detected, a comparison is made between the maximum violation register for that rule and the amount of the violation at the present time at step 1103. The value in the maximum violation variable for the rule is written with the amount of the violation at the present time at step 1104 if the amount of the violation at the present time exceeds the value in the maximum violation variable for that rule. Otherwise, the method proceeds to check whether the violation is the beginning or the end of a violation sequence at step 1105. The violation is the beginning of a violation sequence if the previous time step was not a violation; the violation is the end of a violation sequence if the next time step is not a violation. If the current violation is the beginning or the end of a violation sequence, an element is added to the rule violation linked list at step 1106. At step 1107, the method of FIG. 11 returns to the appropriate place in FIG. 10.

As a particular transistor is checked for violations, entries to the four violation linked lists 1200 are added and the four maximum violation variables 1207–1210 are updated as described above. After the last time step for the particular transistor is analyzed for rule violations, the pointer to the next violation entry for all four linked lists is set to null.

Then, when the transistor has been fully checked for rule violations, its violations are printed out at step 809 into the report file 1409 such as shown above. After the violation linked lists have been written into the report file 1409, the violation linked lists are deallocated at step 810, thereby conserving memory.

The second part 1408 then proceeds to the check the next selected transistor in the transistor linked list 300 using the subsequent data in the spice output file 1406. After the last selected transistor in the transistor linked list 300 has been checked for rule violations, and those violations have been recorded in the report file 1409, step 811 ends the second part. If all the transistors in the linked list have not been checked, step 811 directs the method back to step 808.

When all transistors have been processed, the report file 1409 has been completely written, and step 813 terminates the second part 1408 of the high voltage check program according to the present invention.

While the present invention has been described with reference to its preferred embodiment, that embodiment is offered by way of example, not by way of limitation. For example, various other electrical rules aside from the four explicitly described in the preferred embodiment may be checked. As another example, a different circuit simulator other than spice may be used. Those skilled in the art will be enabled by this disclosure to add to or modify the various methods and apparatuses described herein without departing from the spirit and scope of the present invention. Those various additions and modifications are deemed to lie within the spirit and scope of the invention as set forth in the appended claims.

What is claimed is:

1. A method of performing an electrical rule check, comprising the steps of:

(a) building a rule linked list by reading a rule file, the rule linked list including a plurality of rule structures;

(b) building a first transistor linked list corresponding to a first block, the first transistor linked list including a first plurality of transistor structures with a first plurality of rule pointers;

(c) linking the first transistor linked list and the rule linked list by setting each of the first plurality of rule pointers to point to one of the rule structures in the rule linked list; and (d) rule checking the first block;

wherein step (d) includes the steps of:

(i) rule checking a first selected transistor;

(j) writing selected first transistor violations into a report file;

(k) deallocating violation linked lists;

(l) rule checking a second selected transistor; and (m) writing selected second transistor violations into the report file;

wherein step (i) includes the steps of:

(o) reading a first line of a simulation output file listing first simulated node voltages of the first selected transistor at a first simulation time;

(p) performing a first plurality of rule violation checks on the first selected transistor at the first simulation time using the first simulation node voltages;

(q) reading a second line of the simulation output file listing second simulated node voltages of the first selected transistor at a second simulation time; and (r) performing a second plurality of rule violation checks on the first selected transistor at the second simulation time using the second simulation node voltages.

2. A method as in claim 1, wherein step (p) comprises the steps of:

performing a first junction breakdown violation check; and performing a second junction breakdown violation check.

3. A method as in claim 1, wherein step (p) comprises the steps of:

performing an oxide breakdown violation check;

performing a punch through violation check.

4. A method as in claim 1, wherein each of the rule violation checks comprise the steps of:

detecting a violation;

comparing a violation amount to a maximum violation variable;

updating the maximum violation variable if the violation amount exceeds the maximum violation variable; and storing the first simulation time.

5. A method as in claim 1, wherein each of the rule violation checks comprise the steps of:

detecting a violation;

determining if the violation is a beginning or an end of a violation sequence; and adding the violation to a rule violation linked list if the violation is the beginning or the end of the violation sequence.

6. A method as in claim 1, further comprising the steps of:
(e) deallocating the first transistor linked list;
(f) building a second transistor linked list corresponding to a second block, the second transistor linked list including a second plurality of transistor structures with a second plurality of rule pointers;
(g) linking the second transistor linked list and the rule linked list by setting each of the second plurality of rule pointers to one of the rule structures in the rule linked list; and
(h) rule checking the second block.

7. A method as in claim 1, further comprising the step of, prior to step (b):
reading a command from a transistor file.

8. A method as in claim 7, further comprising the step of:
building a selected instance linked list; and
setting select fields in first plurality of transistor structures based upon the selected instance linked list.

9. A method as in claim 7, further comprising the step of:
searching for a block path from the command in a netlist file.

10. A computer readable storage medium comprising:
computer readable program code embodied on said computer readable storage medium, said computer readable program code for programming a computer to perform a method for performing an electrical rule check, the method comprising the steps of:
(a) building a rule linked list by reading a rule file, the rule linked list including a plurality of rule structures;
(b) building a first transistor linked list corresponding to a first block, the first transistor linked list including a first plurality of transistor structures with a first plurality of rule pointers;
(c) linking the first transistor linked list and the rile linked list by setting each of the first plurality of rule pointers to point to one of the rule structures in the rule linked list; and
(d) rule checking the first block;
wherein step (d) includes the steps of:
(i) rule checking a first selected transistor;
(j) writing selected first transistor violations into a report file;
(k) deallocating violation linked lists;
(l) rule checking a second selected transistor; and
(m) writing selected second transistor violations into the report file;
wherein step (i) includes the steps of:
(o) reading a first line of a simulation output file listing first simulated node voltages of the first selected transistor at a first simulation time;
(p) performing a first plurality of rule violation checks on the first selected transistor at the first simulation time using the first simulation node voltages;
(q) reading a second line of the simulation output file listing second simulated node voltages of the first selected transistor at a second simulation time; and
(r) performing a second plurality of rule violation checks on the first selected transistor at the second simulation time using the second simulation node voltages.

11. A computer readable storage medium comprising computer readable program code as in claim 10, wherein step (p) comprises the steps of:

performing a first junction breakdown violation check; and
performing a second junction breakdown violation check.

12. A computer readable storage medium comprising computer readable program code as in claim 10, wherein step (p) comprises the steps of:
performing an oxide breakdown violation check;
performing a punch through violation check.

13. A computer readable storage medium comprising computer readable program code as in claim 10, wherein each of the rule violation checks comprise the steps of:
detecting a violation;
comparing a violation amount to a maximum violation variable;
updating the maximum violation variable if the violation amount exceeds the maximum violation variable; and
storing the first simulation time.

14. A computer readable storage medium comprising computer readable program code as in claim 10, wherein each of the rule violation checks comprise the steps of:
detecting a violation;
determining if the violation is a beginning or an end of a violation sequence; and
adding the violation to a rule violation linked list if the violation is the beginning or the end of the violation sequence.

15. A computer readable storage medium as in claim 10, further comprising the step of:
(e) deallocating the first transistor linked list;
(f) building a second transistor linked list corresponding to a second block, the second transistor linked list including a second plurality of transistor structures with a second plurality of rule pointers;
(g) linking the second transistor linked list and the rule linked list by setting each of the second plurality of rule pointers to one of the rule structures in the rule linked list; and
(h) rule checking the second block.

16. A computer readable storage medium comprising computer readable program code as in claim 10, further comprising the step of, prior to step (b):
reading a command from a transistor file.

17. A computer readable storage medium comprising computer readable program code as in claim 16, further comprising the step of:
building a selected instance linked list; and
setting select fields in first plurality of transistor structures based upon the selected instance linked list.

18. A computer readable storage medium comprising computer readable program code as in claim 16, further comprising the step of:
searching for a block path from the command in a netlist file.

19. A system for performing an electrical rule check, comprising:
a transistor file structure that specifies blocks to be checked;
a netlist file structure;
a first part coupled to and using the transistor file structure and netlist file structure;
a print file structure coupled to and produced by the first part;
a circuit simulator coupled to and using the print file structure;

a simulator output file structure coupled to and produced by the circuit simulator;

a rule file structure;

a second part coupled to and using the transistor file structure, the netlist file structure, the simulator output structure, and the rule file structure; and a report file structure coupled to and produced by the second part;

(a) wherein the system writes selected first transistor violations into the report file structure; and (b) wherein the system deallocates a violation linked list.

20. A system as in claim 19, wherein the circuit simulator is the SPICE simulator.

* * * * *